United States Patent
Franc et al.

(10) Patent No.: US 8,884,776 B2
(45) Date of Patent: Nov. 11, 2014

(54) ELECTRONIC DEVICE AND ITS PRODUCTION PROCESS

(75) Inventors: Joël Franc, Eckbolsheim (FR); Remy Kirchdoerffer, Grancy (CH)

(73) Assignee: Senstronic (Societe par Actions Simplifiee), Saverne (FR)

( * ) Notice: Subject to any disclaimer, the term of this patent is extended or adjusted under 35 U.S.C. 154(b) by 190 days.

(21) Appl. No.: 13/549,711

(22) Filed: Jul. 16, 2012

(65) Prior Publication Data
US 2013/0015981 A1    Jan. 17, 2013

(30) Foreign Application Priority Data
Jul. 15, 2011 (FR) .................................... 11 56467

(51) Int. Cl.
| G08B 5/00 | (2006.01) |
| H05K 5/06 | (2006.01) |
| G01D 11/24 | (2006.01) |
| H03K 17/95 | (2006.01) |
| H02B 1/00 | (2006.01) |
| H01B 3/10 | (2006.01) |

(52) U.S. Cl.
CPC .............. H05K 5/064 (2013.01); G01D 11/245 (2013.01); H03K 17/9505 (2013.01)
USPC .................... 340/815.4; 361/600; 174/110

(58) Field of Classification Search
USPC ................ 340/815.4; 174/110; 361/600–837; 362/558, 355
See application file for complete search history.

(56) References Cited

U.S. PATENT DOCUMENTS

| 3,958,114 | A | * | 5/1976 | Codrino ........................ 362/581 |
| 5,568,355 | A | * | 10/1996 | Verding et al. ............... 361/676 |
| 5,879,502 | A | * | 3/1999 | Gustafson ..................... 156/292 |
| 6,025,562 | A | * | 2/2000 | Shimizu et al. ........... 174/17 SF |
| 7,019,210 | B2 | * | 3/2006 | Radin et al. ..................... 174/50 |
| 8,446,715 | B2 | * | 5/2013 | Su et al. ................... 361/679.12 |
| 8,507,803 | B2 | * | 8/2013 | Yamamoto et al. ........... 174/255 |
| 2007/0112273 | A1 | * | 5/2007 | Rogers ......................... 600/475 |

FOREIGN PATENT DOCUMENTS

| DE | 195 04 608 A1 | 8/1996 |
| DE | 198 32 533 C1 | 11/1999 |

OTHER PUBLICATIONS

French Search Report, dated Mar. 13, 2012, from corresponding French application.

* cited by examiner

*Primary Examiner* — Jennifer Mehmood
*Assistant Examiner* — Omar Casillashernandez
(74) *Attorney, Agent, or Firm* — Young & Thompson

(57) ABSTRACT

An electronic device, in particular of the sensor or detector type, includes a housing having first and second longitudinal opposite and sealed ends. The housing contains an electronic card and with its inside volume being filled by an insulating filler material that coats the card, its components, and the end of a connecting cable connected to the card, the housing including an opening at its second end, which is sealed by a connected piece that is equipped with a passage opening for the connecting cable. The sealing piece includes at least a second through opening for injecting filler material (5), this or each second opening being sealed by a plug (9) made of a material that conducts and diffuses light, of which a portion is positioned in the vicinity of, and even in contact with, at least one light signaling element (10) or light indicator carried by the card (4).

16 Claims, 6 Drawing Sheets

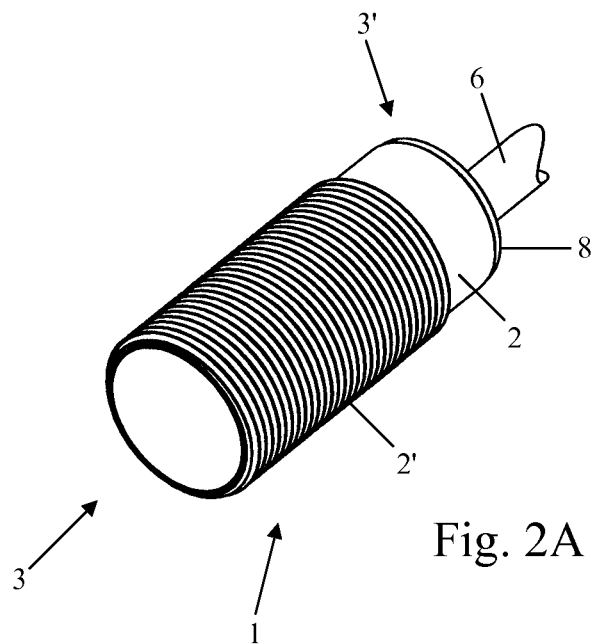
Fig. 2A
Fig. 2
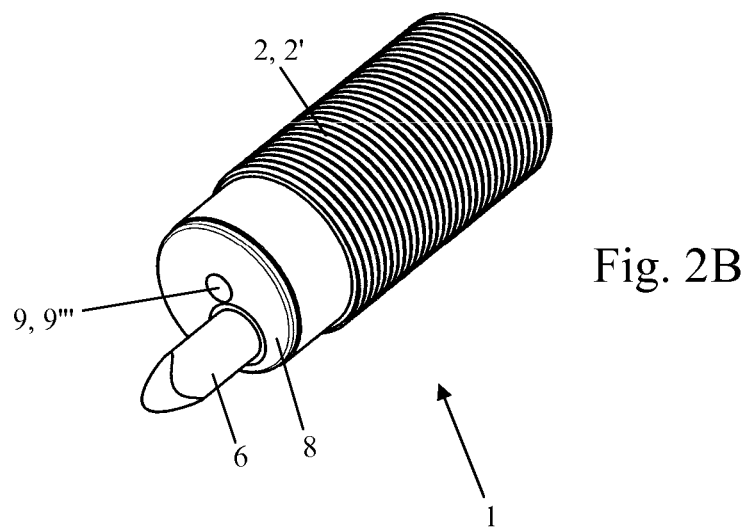
Fig. 2B

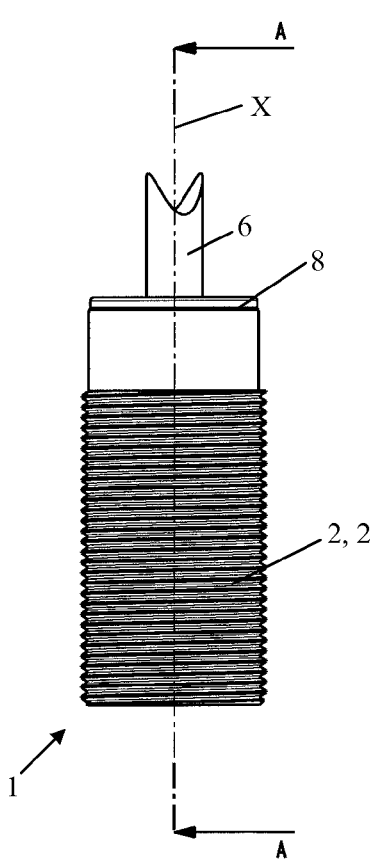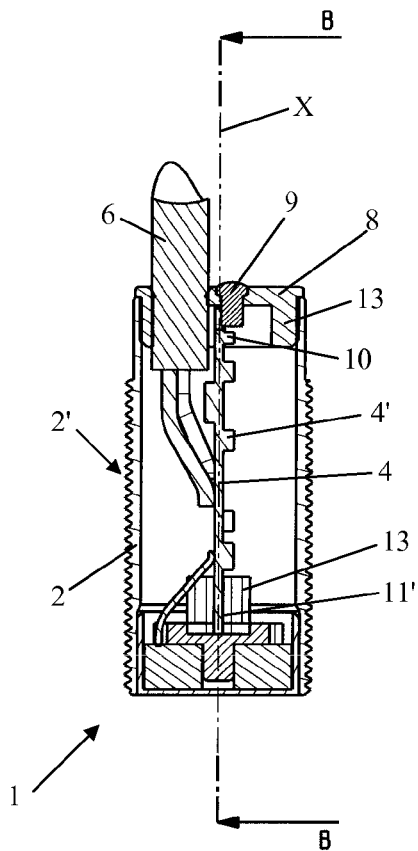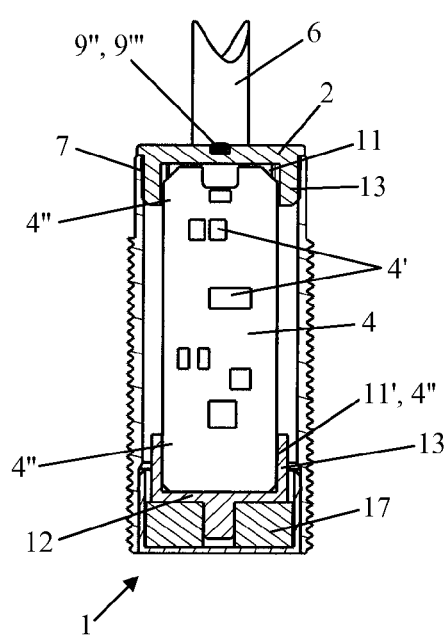
Fig. 3A  Fig. 3B  Fig. 3  Fig. 3C

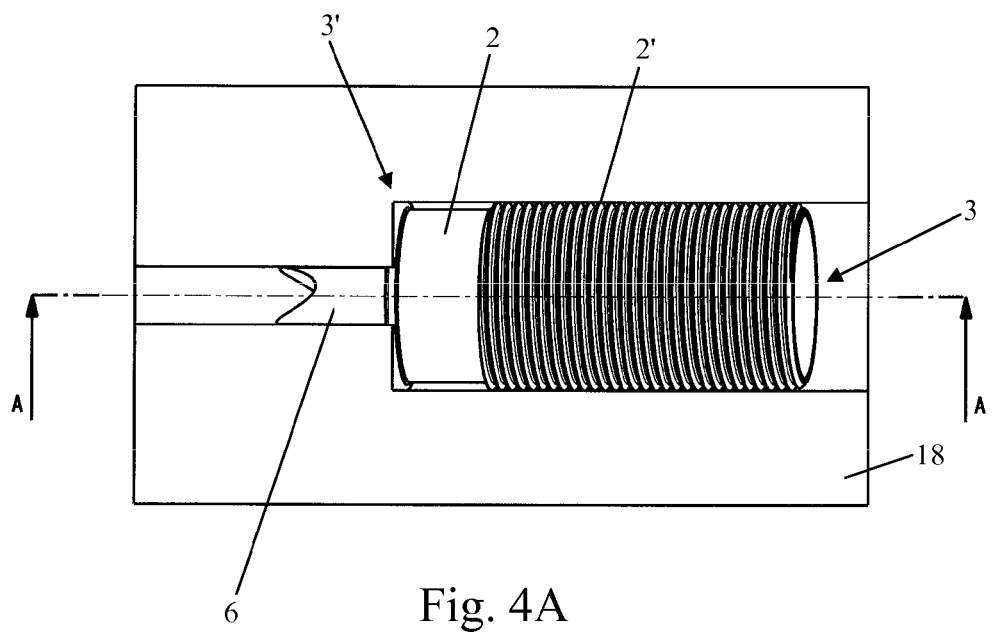
Fig. 4A
Fig. 4
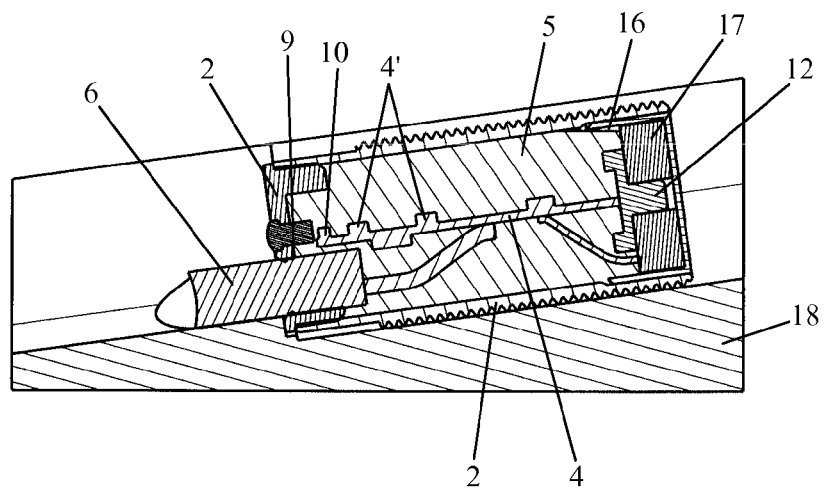
Fig. 4B

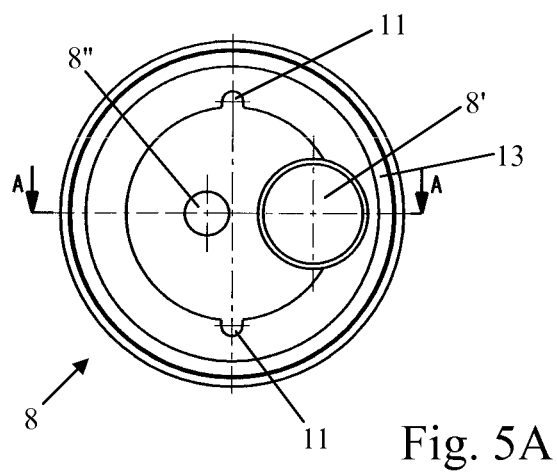
Fig. 5A
Fig. 5
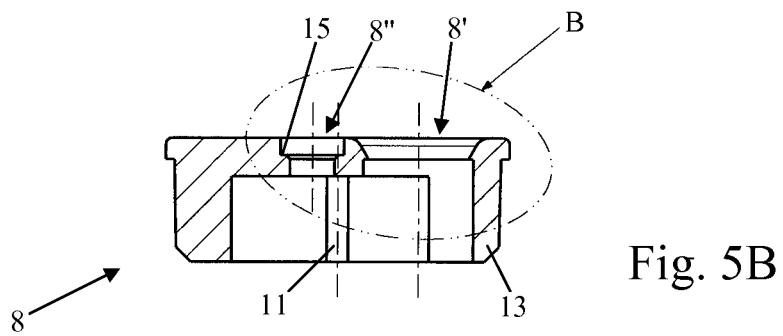
Fig. 5B
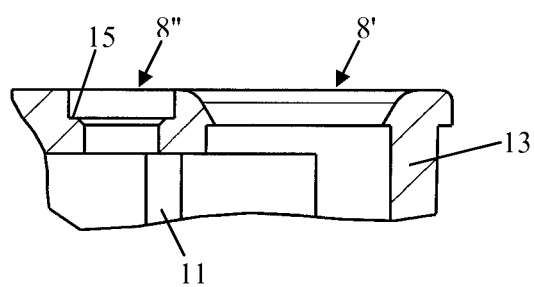
Fig. 6

ELECTRONIC DEVICE AND ITS PRODUCTION PROCESS

This invention relates to the field of electronic devices in which, on the one hand, an electronic card is mounted in a housing and connected to a connecting cable, and, on the other hand, a coating material is used to protect and insulate said card and to ensure its locking in position in the housing.

More particularly, the invention relates to an electronic device, in particular of the sensor or detector type, comprising a housing essentially of tubular shape, preferably with a circular cross-section, having first and second longitudinal ends that are opposite and sealed, with this housing containing an electronic card that carries components and that is arranged longitudinally in said housing, and with its inside volume being filled essentially completely by an insulating filler material that coats said card and its components, as well as the end of a connecting cable that is connected to said card. This housing also comprises an opening at its second end, which is sealed by a connected piece that is equipped with a passage opening for the connecting cable.

BACKGROUND OF THE INVENTION

At present, during the resin-coating phase (injection of filler material) and before the installation of the sealing piece that forms a cable guide (plug or hermetic hood and without vent holes), it is necessary to let in, during the resin coating, a rather large amount of air that is difficult to quantify in a repeated manner into the housing so as to allow the complete insertion of the sealing piece (airtight closure).

This solution exhibits the drawback of allowing a rather large amount of air into the inside volume of the housing.

As a result, and instead of ending in a total coating of the electronic components, the presence of this air in the device causes environmental changes, which can in particular induce risks of damage or deterioration of components and/or defects of electrical insulation.

In addition, it is often advantageous for this type of device to be able to visually indicate a state or their state from among several possible states (detection, absence of detection, malfunction, . . . ) by a light display that is visible at the housing.

The installation of the signaling means on the housing or their integration within the wall of the housing is problematic, taking into account mounting conditions and environments in which these devices are used.

Actually, in these known embodiments, the light element is at least in part projecting relative to the housing and requires the installation of an additional transparent protective means (cap or cover). This exposure to the outside environment, possibly aggravated by a prominence relative to the housing, of the light element is extremely unfavorable: limited options for installation, exposure to impact, exposure of the power supply line in the event of detachment, modification of the space requirement and the outside shape of the housing.

A known solution can consist in mounting the light sources of the signaling means inside the housing and in transmitting the light information for signaling through the transparent or translucent sealing piece.

However, this solution is not very effective (diffusion of light, low illumination and little visibility over the entire piece, plug that is necessarily entirely transparent or two-material) and/or requires specific additional pieces when the light element is not in the immediate vicinity of the sealing piece (light guide).

Nevertheless, the result is then the necessity for a specific positioning of the light guide(s) relative to the source(s) and the specific development of (a) guide(s) that is/are suitable for the above-mentioned type of devices, with the obligation not to interfere with the specific positioning and the good coating of the card and to preserve the integrity and the sealing of the device.

In addition, the document U.S. Pat. No. 6,025,562 discloses different embodiments of an electronic device of the above-mentioned type and a process for the production of such a device.

In a first embodiment, described in relation to FIG. 35 of this document and constituting the state of the art for the teaching of said document, a tubular housing that contains the detection element receives a first quantity of a first resin, and then a second quantity of a second resin. Next, a closing piece, forming a clamp and through which the connecting cable passes, is installed, and then additional quantities of the second resin are successively injected through the passage opening of the cable. This closing piece comprises a portion of transparent wall, but does not comprise a second opening for the injection of resin.

In the different variant embodiments of a second embodiment that is disclosed by the document U.S. Pat. No. 6,025,562, emerging from FIGS. 1 to 30, the housing that contains the detection element is sealed by a closing piece that forms a clamp and through which the cable passes. The inside volume of the unit is filled with resin by injection through a secondary opening that is provided in the closing piece. However, this secondary opening is not sealed by a connected plug but by the injected material (undefined finishing and outward appearance). A light-conducting portion can be integrated in the closing piece (FIG. 8), in line with the first embodiment disclosed by U.S. Pat. No. 6,025,562.

SUMMARY OF THE INVENTION

A first object of the invention is to propose a simple solution to the problems disclosed above without uselessly multiplying the components, without making the general composition of the device in question more complex and/or without significantly complicating its production process.

For this purpose, the object of the invention is an electronic device of the type mentioned above and that is characterized in that the sealing piece that is used comprises at least a second through opening that allows the injection of filler material, this or each second opening being sealed by a connected plug made of a material that conducts and diffuses light, of which a portion is positioned in the vicinity of, and even in contact with, at least one light signaling means or light indicator carried by the card.

In addition, an additional specific difficulty for the embodiment of this type of device resides in the necessity of avoiding any contact between, on the one hand, the electronic card and the components that it carries and, on the other hand, the housing, in general made of metal, for electrical reasons (short-circuiting, grounding) and for mechanical reasons (shocks, vibrations), while promoting, if possible, an optimum coating of the card and components (limitation of the possible obstacles to the homogeneous distribution of the resin in the housing and coating of the majority of the card).

For the purpose of overcoming this additional difficulty, the invention may provide that the device comprises cooperative means for positioning the card in the housing, preferably in a centered manner and advantageously with wedging radially relative to the longitudinal direction of said housing, with a first part of said positioning means being present on the sealing piece that forms a cable guide and the other complementary part of said means being present on a substrate piece that is mounted in or on the housing in the vicinity of the first end of the latter.

According to one embodiment of the invention, the first part of the positioning means consists of two opposite groove portions, made in an annular wall or portions of opposite walls respectively of the sealing piece and the substrate piece and designed to accommodate with wedging edge parts of the card, with the latter also being locked in position in the direction of the median longitudinal axis of the housing between the sealing and substrate pieces.

So as to make possible a simple mounting and in particular without gluing, the sealing piece advantageously can be made of a semi-rigid plastic material and can comprise an annular wall that is at least slightly elastically deformable and that interlocks with an airtight peripheral contact in the opening of the second end of the housing. In addition, the passage opening of the connecting cable is advantageously offset relative to the longitudinal axis of the housing and eccentric relative to the sealing piece.

In accordance with a practical variant embodiment, the light-guide plug can comprise, on the one hand, an elongated, preferably cylindrical, body, of which one free end comes into position in the immediate vicinity of the at least one light signaling means and, on the other hand, an enlarged head, preferably with an upper portion in the shape of a dome, formed at the other end of the elongated body, with the second opening comprising a suitable shoulder for a wedged interlocking of said head, advantageously in such a way that only the dome-shaped portion emerges at the sealing piece and that the free end is positioned in a suitable manner relative to the signaling means.

The plate-shaped wall of the sealing piece advantageously has an adequate thickness for housing the above-mentioned shoulder at the second opening and for being able to ensure a function of guiding the connecting cable at the first opening.

In addition, the offsetting of the opening of the passage of the cable makes it possible for the latter to be held laterally by an adjacent portion of the annular wall of the sealing piece.

To allow a positioning of the plug facing the light signaling means and thus to collect maximum light, the card can be equipped with a cut-out that allows the engagement of the plug and its centering relative to the above-mentioned means carried by the card.

Preferably, the air bubble that contains the housing of the device is positioned, after drying or cross-linking of the filler material, at a distance, on the one hand, from the electronic card and its components, and, on the other hand, from the second end of said housing, as well as the connecting wires of the connecting cable or the like to the card (the migration of the air that is present is done essentially at the beginning of the drying).

BRIEF DESCRIPTION OF THE DRAWINGS

The invention will be better understood owing to the description below, which relates to a preferred embodiment, provided by way of non-limiting example, and explained with reference to the accompanying diagrammatic drawings, in which:

FIGS. 2A and 2B are perspective views in two different directions of the sensor that is shown in FIG. 1;

FIG. 3A is a lateral elevation view of the sensor that is shown in FIGS. 1 and 2;

FIGS. 3B and 3C are cutaway views respectively along A-A of the sensor that is shown in FIG. 3A and along B-B of the sensor that is shown in FIG. 3B;

FIGS. 4A and 4B are respectively top and cutaway views along A-A of a sensor according to any of FIGS. 1 to 3, installed in an oriented and indexed manner on a drying substrate;

FIGS. 5A and 5B are respectively bottom and cutaway views along A-A of a sealing piece that is part of the sensor that is shown in FIGS. 1 to 4;

FIG. 6 is a view on a different scale of the detail B of FIG. 5B, and

DETAILED DESCRIPTION OF THE PREFERRED EMBODIMENTS

Figure 1:
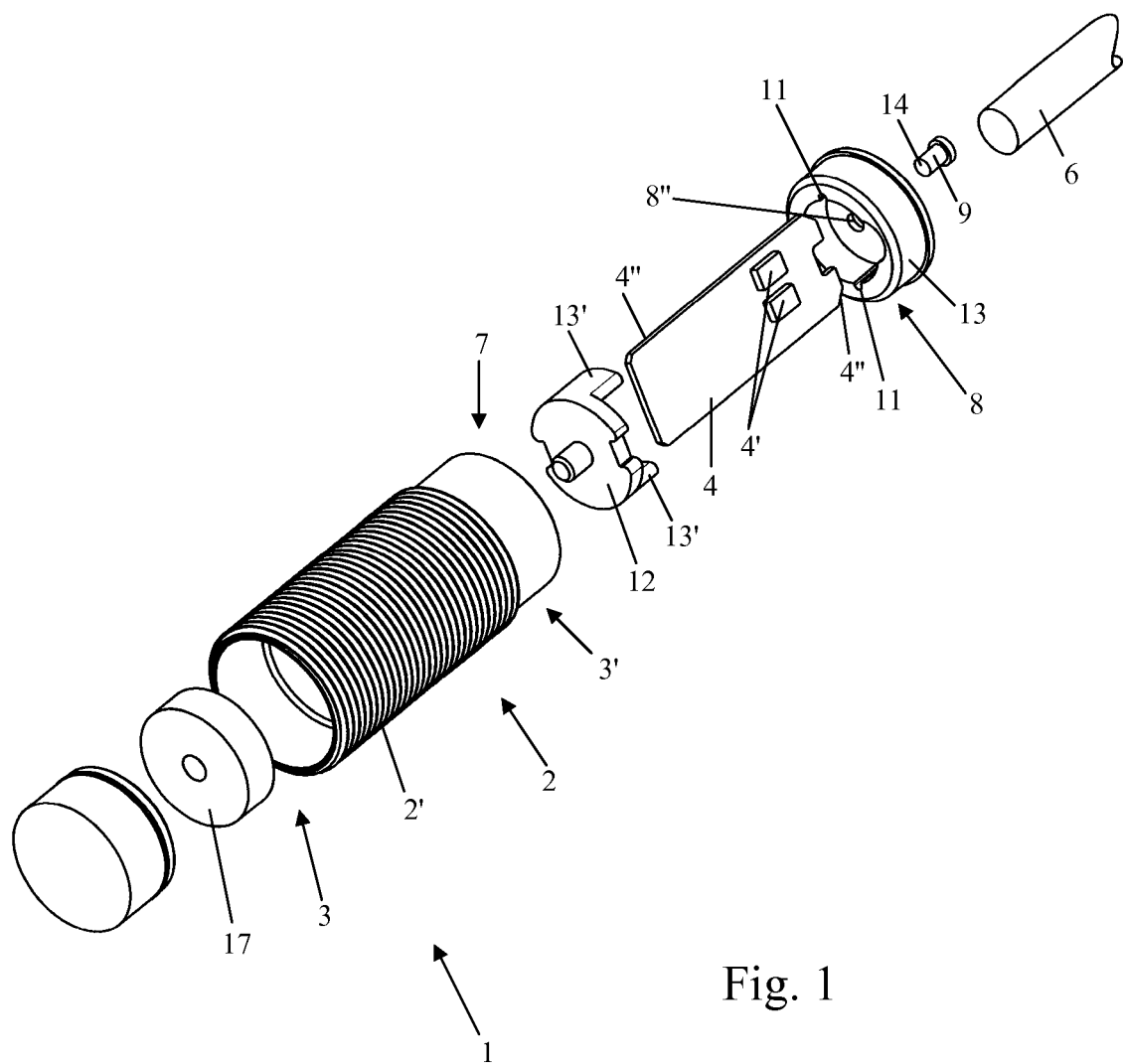
FIG. 1 is an exploded view of an electronic device, in the form of an inductive sensor, in accordance with the invention.
Figure 7:
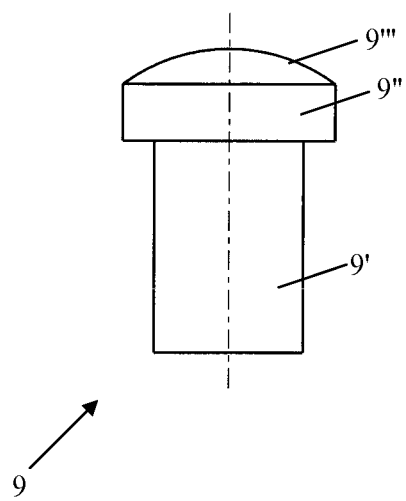
FIG. 7 is a side elevation view of the light-guide plug that is part of the sensor that is shown in FIGS. 1 to 4.

FIGS. 1 to 4, in particular accompanying figures, illustrate an electronic device 1, in particular of the sensor or detector type, comprising a housing 2 that is essentially of tubular shape, preferably with a circular cross-section, having opposite and sealed first and second longitudinal ends 3 and 3'. This housing 2 contains an electronic card 4 that carries components 4' and that is arranged longitudinally in said housing 2, and its inside volume is essentially completely filled by an insulating filler material 5 that coats said card and its components, as well as the end of a connecting cable 6 that is connected to said card. This housing also comprises an opening 7 at its second end 3', which is sealed by a connected piece 8 that is equipped with a passage opening 8' for the connecting cable.

In accordance with the invention, said sealing piece 8 comprises at least a second through opening 8" that allows the injection of filler material 5. This or each second opening 8" is sealed by a connected plug 9 (piece that is produced separately and mounted by interlocking in the opening 8" that it seals) and made of a material that conducts and diffuses light, of which a portion is positioned in the vicinity of, and even in contact with, at least one light signaling means 10 or light indicator carried by the card 4.

By providing a sealing piece 8 with an opening 8" for injection of filler material 5 (resin or the like) and a light-guide plug 9 made of a material that is suitable and positioned in an adequate manner, it is possible:
 via the "plug" function: to improve the resin-coating quality of the resulting devices or products by very significantly reducing the amount of air that is imprisoned in the housing 2 (socket), while obtaining a good finishing level and an outward appearance that is defined and reproducible with the product (no apparent resin on the surface of the product).
 via the "light-guide" function: to conduct and to diffuse toward the outside the light that is produced by a signaling means or light indicator (DEL or the like), while effectively protecting the latter, mechanically (direct mechanical shocks) and electrically (level of electrical insulation), since it is located inside the housing and is itself also protected by the resin.

By the provision of positioning means 11 at the sealing piece 8 that forms a cable guide, it is possible to produce a self-alignment of the card 4 relative to this piece 8 and therefore relative to the plug 9 and to ensure a reliable positioning of the card 4 in the housing 2.

Actually, the opposite groove portions 11 of the piece 8 in which the opposite edges of the card 4 slide (during the installation of the cable-guide sealing piece) ensure the self-alignment of the light indicator 10 (single or multiple LED) relative to the sealing plug 9 and light guide, and thus an optimal collection and guiding of the light that is transmitted outside of the socket that forms housing 2.

In addition, in association with a card substrate piece 12, equipped with groove portions 11', the groove portions 11 also make it possible to ensure a repeatable positioning of the card 4 (with no bending of the card 4 that is linked to the cable 6 that is connected to it).

Thus, the card insulation 4/metal housing 2 distance remains constant and controlled.

In most cases, this arrangement makes it possible (according to the level of electrical insulation required) to avoid the addition of insulating film to the inside of the socket 2, while taking advantage of a good level of electrical insulation because of a uniform resin coating 5 that extends all around the card 4, its components and its electrical connection sites.

Made in a semi-rigid plastic material, the sealing piece 2 that forms a cable guide/card guide is (generally after the bulk of the resin coating) interlocked in the opening 7 of the housing 2 (socket) without requiring glue, this because of its elasticity (thus avoiding any risk of a trace of glue) and while ensuring good sealing, in particular during the drying phase of the resin 5 (with no resin leak).

The same is true during the installation of the sealing plug 9 that acts as a light guide (for example immediately after the final resin injection phase). The semi-rigid material of the piece 2 ensures the hold of the plug 9 as well as the seal during the drying phase of the resin.

The shoulder 15 that is made in the opening 8" of the piece 8 limits the insertion of the plug 9 into the housing 2, thus contributing, once completely interlocked, to a precise positioning of said plug 9 relative to the signaling DEL 10 that is implanted on the card 4 (FIGS. 3B, 4B and 6).

Furthermore, it is advantageous not to directly locate the support surface of the plug 9 on the surface of the piece 8 but slightly inserted in or removed from the latter, which contributes to better protecting said plug 9.

Thus, any risk of external hooking or detaching is prevented, and it thus is possible to embed this plug 9 in the surface of the piece 8, which also improves the appearance of the product (only the dome portion 9''' of the head 9" of the plug 9 is prominent), while providing a surface of light diffusion that is clearly apparent on the outside (also laterally to the axis of the product).

This suitable and economical assembly method significantly simplifies the production of products and improves their reliability and their appearance.

It should be noted that the sealing piece 8 can be installed either before resin-coating (in which case all of the resin is introduced through the passage opening 8" of the plug 9) or at the end of resin-coating, so as to quickly deposit maximum resin in the housing 2 through the opening 7 (the finalization of the resin-coating taking place in all cases by the passage opening 8" that the plug 9 ultimately seals).

Preferably, as FIGS. 1 to 4 show, the device 1 consists of a sensor or detector of presence or proximity, for example of the inductive, optical, magnetic or capacitive type, whose functional element 17 that defines the active surface is mounted at the first end 3 of the housing 2, whereby the latter advantageously comes in the form of a metal socket that is equipped with outside threading 2'.

Thanks to the integration in the housing and the complete coating of the components and the card, the invention makes it possible to result in a double insulation between, on the one hand, the electronic components (including light signaling) and the card, and, on the other hand, the exterior, allowing supply and operation at high voltage where there is no danger in the event of rupture or impact.

The object of the invention is also a process for the production of a device 1 as described above.

This process consists in supplying a tubular housing 2, of which a first end 3 is sealed, an electronic card 4 that is equipped with suitable components 4', and at least one light signaling means 10, a connecting cable 6, a sealing piece 8 that is equipped with a passage opening 8' for the cable 6, and an insulating filler material 5 in an injectable form to produce different electrical connections at the card 4 and finally to mount the latter in the housing 2 and to inject the filler material 5 partially or completely into the latter, before and/or after installation of the sealing piece 8 at the second end 3' of said housing 2.

This process is characterized in that it consists in providing at least a second opening 8" in the sealing piece 8, in injecting all or at least a complementary portion of the filler material 5 through this second opening 8", and in sealing this second opening 8" by a plug 9 made of a material that conducts and diffuses the light, with a portion 14 of the latter coming to be positioned in the vicinity of, and even in contact with, said at least one light signaling means 10.

Advantageously, after injection of the filler material 5 and total sealing of the second end 3' of the housing 2 by installation of the plug 9, the process consists in positioning said housing 2, during the phase for drying and/or cross-linking of the injected material, with an orientation and an indexing such that the remaining air bubble 16 is located at a distance, on the one hand, from the electronic card 4 and its components 4', 10, and, on the other hand, from the second end 3' of said housing 2, as well as connecting wires of the connecting cable 6 or the like to the card 4.

Preferably, after installation of the card 4 on a substrate piece 12 that is mounted in the housing 2, the process consists in injecting the majority of the filler material 5 into the housing 2 and then in installing the sealing piece 8 into the opening 7 of the second end 3' of the housing 2, this by wedging the card 4, in next injecting a complementary quantity of filler material 5 through the second opening 8" of the sealing piece 8, essentially to fill the remaining inside volume of the housing 2 except for a slightly larger elementary volume than the volume of the body 9' of the plug 9, in installing said light-guide plug 9 in such a way as to seal said second opening 8" and finally to allow the drying or the cross-linking of the filler material 5 in an inclined and indexed position, with the indexing being determined relative to the connecting cable 6.

One skilled in the art understands that, to allow the insertion of the plug 9 at the end of resin-coating, it is necessary to keep a small amount of air in the socket 2 (greater than the volume of the body 9' of the plug).

For aesthetic reasons (no air bubble on the surface of the cable guide) and for functional reasons (no air bubble on the electronic card 2), it is advantageous to confine the little air remaining at a specific and repeatable location, during the drying phase of the resin 5.

For this purpose, the eccentric arrangement of the passage opening 8' of the cable 6 in the piece 8 contributes to the referencing of the orientation of the card 4 inside the socket 2. Thus, by combining a suitable drying substrate 18 (substrate that obtains from its definition an orientation and a preferred slope of the socket 2) with such a unit, it is possible from the outside, during the drying phase of the resin, to control precisely the location where the little air remaining 16 (FIGS. 4A and 4B) will be confined (during the drying of the resin).

This arrangement makes it possible to position the residual air bubble 16 in a zone that has no components 4', 10 and thus to ensure good impregnation of resin over all of the electronic components.

Thanks to the invention, it is therefore possible in particular to:

Make it possible to limit considerably the amount of residual air during the resin-coating phase.

Making possible good transmission and diffusion of the light while effectively protecting the light indicator (single or multiple DEL).

Ensuring, in combination with a cable-guide element that is made of a semi-rigid material, simple and glueless mounting, contributing to the quality and the simplicity of assembly of the devices 1, as well as to a reliable positioning of the card 4 (in combination with a card substrate 12).

Of course, the invention is not limited to the embodiment that is described and shown in the accompanying drawings. Modifications are possible, in particular from the standpoint of the composition of the various elements or by substitution of equivalent techniques, without thereby exceeding the field of protection of the invention.

The invention claimed is:

1. An electronic device, comprising:
    a housing essentially of tubular shape having first and second longitudinal ends that are opposite to each other and sealed,
    said housing containing an electronic card that carries components thereon and that is arranged longitudinally in said housing,
    said housing further containing a connecting cable connected to said card,
    an inside volume of said housing being filled essentially completely by an insulating filler material that coats said electronic card and the components, as well as an end of the connecting cable that is connected to said card,
    said housing comprising an opening at the second end which is sealed by a connected sealing piece (8) that has a passage opening for the connecting cable to pass therethrough,
    said sealing piece (8) comprising at least a second through opening (8") that permits injection of said filler material (5), and
    said second opening (8") being sealed by a connected plug (9) that is made of a material that conducts and diffuses light, a portion (14) of said plug (9) being positioned in the vicinity of at least one light signaling means (10) carried by the card (4) in order to transmit light emitted from said light signaling means to an exterior of the housing; and
    positioning structures (11, 11') that position the card (4) in the housing (2),
    wherein a first of said positioning structures (11) is located on the sealing piece (8), and a complementary second of said positioning structures (11') is located on a substrate piece (12) that is mounted in or on the housing (2) in the vicinity of the first end (3) of the housing, and
    wherein the first and second positioning structures (11, 11') comprise two opposite groove portions, made in an annular wall (13) or portions of opposite walls (13') respectively of the sealing piece (8) and the substrate piece (12), said positioning structures configured to accommodate with wedging edge parts (4") of the card (4), said wedging edge parts (4") being lockable in position in a direction of the median longitudinal axis (X) of the housing (2) between the sealing and substrate pieces (8, 12).

2. The device according to claim 1,
    wherein the sealing piece (8) is made of a semi-rigid plastic material, and comprises an annular wall (13) that is at least slightly elastically deformable and that interlocks with an airtight peripheral contact in the opening (7) of the second end (3') of the housing (2), and
    wherein the passage opening (8') of the connecting cable (6) is offset relative to the longitudinal axis (X) of the housing (2) and eccentric relative to the sealing piece (8).

3. The device according to claim 1,
    wherein the light-guide plug (9) comprises
        an elongated body (9'), of which a first free end (14) comes into position in the immediate vicinity of the at least one light signaling means (10), and
        an enlarged head (9") formed at an opposite second end of the elongated body (9'),
    the second opening (8") comprising a shoulder (15) suitable for a wedged interlocking with said enlarged head (9") of said light-guide plug (9), and
    wherein the first free end (14) is positioned in a suitable manner relative to the at least one light signaling means (10) so that said light-guide plug (9) can transmit light emitting from said at least one light signaling means (10).

4. The device according to claim 1, wherein the housing (2) contains an air bubble (16) that is positioned at a distance from the electronic card (4) and the components thereon (4', 10), and is also distanced from the second end (3') of said housing (2) and connecting wires of the connecting cable (6).

5. The device according to claim 1, further comprising:
    a sensor or detector of presence or proximity, of which a functional element (17) that defines an active surface is mounted at the first end (3) of the housing (2).

6. A process for the production of an electronic device according to claim 1, comprising the steps of:
    providing
        a tubular housing, of which a first end is sealed,
        an electronic card having equipped thereon suitable components and at least one light signaling means,
        a connecting cable,
        a sealing piece with a passage opening for the connecting cable and an insulating filler material, in an injectable form, to pass therethrough, for providing electrical connections to the electronic card, for mounting the electronic card in the tubular housing, and for permitting injection of the filler material partially or completely into the tubular housing, before and/or after installation of the sealing piece at the second end of said housing;
    providing at least a second opening (8") in the sealing piece (8);
    injecting all or at least a complementary portion of the filler material (5) through said second opening (8"); and
    sealing said second opening (8") by a plug (9) made of a material that conducts and diffuses the light, a portion (14) of said material positioned in the vicinity of said at least one light signaling means (10) in order to permit transmission of light from said light signaling means (10).

7. The process of production according to claim 6, further comprising:
    after injection of the filler material (5) and sealing of the second end (3') of the housing (2) by installation of the plug (9), positioning said housing (2), during a phase for drying and/or cross-linking the injected material, with an orientation and indexing such that a remaining air bubble (16) is located at a distance from the electronic card (4) and the components (4', 10) and from the second end (3') of said housing (2) and connecting wires of the connecting cable (6) connecting to the card (4).

8. The process of production according to claim 6, further comprising:

after installation of the card (4) on a substrate piece (12) that is mounted in the housing (2), injecting a majority of the filler material (5) into the housing (2); and then, installing the sealing piece (8) in the opening (7) of the second end (3') of the housing (2) by wedging the card (4);

next injecting a complementary amount of filler material (5) through the second opening (8") of the sealing piece (8), essentially for filling a remaining inside volume of the housing (2), except for an elementary volume that is slightly larger than a volume of the body (9') of the plug (9);

installing said light-guide plug (9) in such a way as to seal said second opening (8"); and allowing the drying or the cross-linking of the filler material (5) in an inclined and indexed position, with the indexing being determined relative to the connecting cable (6).

9. The process of production according to claim 7, further comprising:

after installation of the card (4) on a substrate piece (12) that is mounted in the housing (2), injecting the majority of the filler material (5) into the housing (2); and then installing the sealing piece (8) in the opening (7) of the second end (3') of the housing (2) by wedging the card (4);

next injecting a complementary amount of filler material (5) through the second opening (8") of the sealing piece (8), essentially for filling a remaining inside volume of the housing (2), except for an elementary volume that is slightly larger than a volume of the body (9') of the plug (9);

installing said light-guide plug (9) in such a way as to seal said second opening (8"); and allowing the drying or the cross-linking of the filler material (5) in an inclined and indexed position, with the indexing being determined relative to the connecting cable (6).

10. The device according to claim 1, wherein the housing has a circular cross-section.

11. The device according to claim 1, wherein the positioning structures (11, 11') position the card in the housing in a centered manner.

12. The device according to claim 1, wherein the positioning structures (11, 11') position the card in the housing with wedging radially relative to the direction of the median longitudinal axis (X) of said housing.

13. The device according to claim 3, wherein the elongated body of the light-guide plug (9) is cylindrical.

14. The device according to claim 3, wherein the enlarged head (9") comprises an upper portion in the shape of a dome (9''').

15. The device according to claim 3, wherein the shoulder interlocks with said enlarged head (9") of said light-guide plug (9) in such a way that only the dome-shaped portion (9''') emerges at the sealing piece (8).

16. The device according to claim 5, wherein the active surface of the functional element is in the form of a metal socket that is equipped with an outside threading (2').

\* \* \* \* \*